United States Patent
Gaudin et al.

(10) Patent No.: US 10,381,059 B2
(45) Date of Patent: Aug. 13, 2019

(54) MAGNETIC MEMORY ELEMENT (71) Applicants: CENTRE NATIONAL DE LA RECHERCHE SCIENTIFIQUE, Paris (FR); COMMISSARIAT A L'ENERGIE ATOMIQUE ET AUX ENERGIES ALTERNATIVES, Paris (FR)

(72) Inventors: Gilles Gaudin, Le Sappey en Chartreuse (FR); Ioan Mihai Miron, Grenoble (FR); Olivier Boulle, Grenoble (FR); Safeer Chenattukuzhiyil, Kerala (IN)

(73) Assignees: CENTRE NATIONAL DE LA RECHERCHE SCIENTIFIQUE, Paris (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/768,522

(22) PCT Filed: Oct. 15, 2016

(86) PCT No.: PCT/FR2016/052568
§ 371 (c)(1),
(2) Date: Apr. 13, 2018

(87) PCT Pub. No.: WO2017/064394
PCT Pub. Date: Apr. 20, 2017

(65) Prior Publication Data
US 2018/0308534 A1 Oct. 25, 2018

(30) Foreign Application Priority Data
Oct. 16, 2015 (FR) ...................... 15 59914

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1673* (2013.01); *G11C 11/1675* (2013.01); *H01L 43/02* (2013.01); *H01L 43/08* (2013.01)

(58) Field of Classification Search
CPC .................................................. G11C 11/161
(Continued)

(56) References Cited

U.S. PATENT DOCUMENTS 6,707,122 B1    3/2004  Hines
8,236,576 B2 *  8/2012  Han .................. B82Y 25/00
                                               257/20

(Continued)

FOREIGN PATENT DOCUMENTS

WO    WO 2016/113503 A1    7/2016

OTHER PUBLICATIONS

International Search Report, dated Jan. 26, 2017, in International Application No. PCT/FR2016/052568.

*Primary Examiner* — Hoai V Ho
(74) *Attorney, Agent, or Firm* — Knobbe, Martens, Olson & Bear, LLP (57) ABSTRACT

A magnetic memory element includes a contact with a magnetic layer portion between a conductive layer portion and a non-magnetic layer portion. The magnetic layer has a magnetization perpendicular to the plane of the layers, and an angled conductive track-having a central portion extended by two arms, the contact being entirely arranged on the track. For each arm, a current flowing towards the contact along the median axis of the arm encounters the portion of the contact nearest to the arm primarily on the left (Continued)

thereof for one of the arms, and primarily on the right thereof for the other arm.

12 Claims, 9 Drawing Sheets

(51) Int. Cl.
*H01L 43/08* (2006.01)
*H01L 43/02* (2006.01)

(58) Field of Classification Search
USPC .......................................................... 365/158
See application file for complete search history.

(56) References Cited

U.S. PATENT DOCUMENTS

2009/0273972 A1 11/2009 Han
2010/0207220 A1 8/2010 Kim
2012/0020152 A1 1/2012 Gaudin

* cited by examiner

MAGNETIC MEMORY ELEMENT

PRIORITY AND CROSS REFERENCE TO RELATED APPLICATIONS

This application is the U.S. National Phase Application under 35 U.S.C. § 371 of International Application No. PCT/FR2016/052568, filed Oct. 5, 2016, designating the U.S. and published as WO 2017/064394 A1 on Apr. 20, 2017, which claims the benefit of French Application No. FR 1559914, filed Oct. 16, 2015. Any and all applications for which a foreign or a domestic priority is claimed is/are identified in the Application Data Sheet filed herewith and is/are hereby incorporated by reference in their entirety under 37 C.F.R. § 1.57.

The present patent application claims the priority of French patent application FR15/59914, which will be considered an integral part of the present description.

FIELD

The present application relates to a magnetic memory element, and more particularly a magnetic memory element of the type with current-induced reversal.

BACKGROUND OF THE INVENTION

Figure 1A:
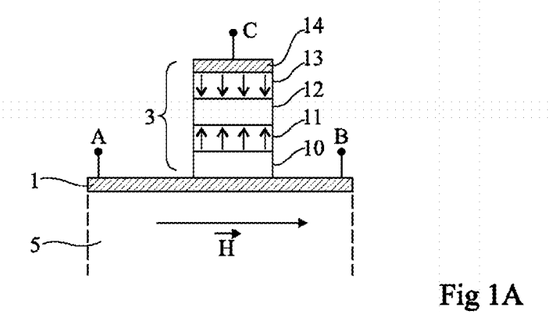
Figure 1B:
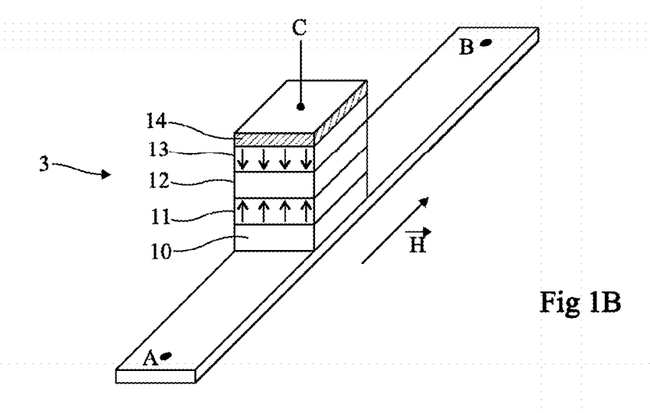
Figure 1C:
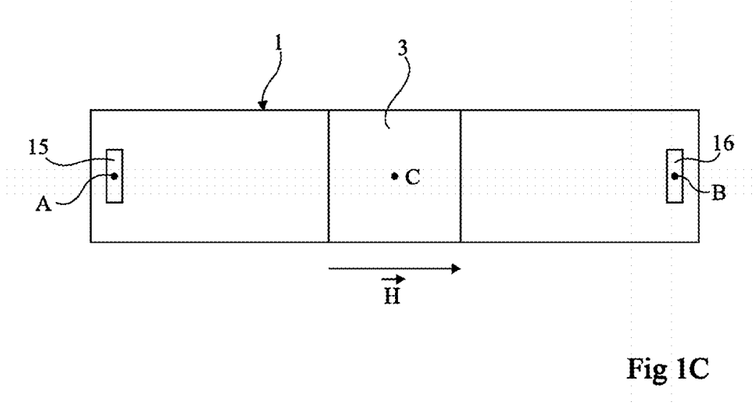

French patent no. 2,963,152 describes a magnetic memory element as shown schematically in FIGS. 1A, 1B and 10. FIGS. 1A and 1B respectively show a sectional view and a perspective view of a magnetic memory element as described in connection with FIGS. 1c-1f, 2a-2b and 3a-3d of French patent no. 2,963,152. FIG. 10 is a simplified top view of this memory element.

As illustrated by FIGS. 1A and 1B, this memory element comprises a contact 3 above a conductive track 1. The contact 3 comprises a stack of regions, each of which is formed by a portion of a thin layer or a stack of several thin layers. The conductive track 1 is for example formed on a substrate 5 made up of a silicon wafer covered with a layer of silicon oxide and is connected across terminals A and B. The stack making up the contact 3 successively comprises, from the track 1, a region 10 made from a nonmagnetic conductive material, a region 11 made from a magnetic material, a region 12 made from a nonmagnetic material, a region 13 made from a magnetic material and an electrode 14. The material of the layer 12 can be conductive; this is preferably an insulating material thin enough to be able to be traversed by tunnel effect electrons. There is a structural difference between the nonmagnetic regions 10 and 12 so as to have an asymmetrical system in a direction orthogonal to the plane of the layers. This difference may in particular result from the difference in material, thickness, or growth mode of these layers.

Lists of materials able to make up the various layers are given in the aforementioned patents. The magnetic materials of the regions 11 and 13 are formed under conditions such that they have a magnetization oriented orthogonally to the plane of the layers. The magnetic material of the layer 13 is formed under conditions such that it retains an intangible magnetization (trapped layer). The upper electrode layer 14 is connected to a terminal C.

The programming of the memory element is done by circulating a current across the terminals A and B, while a field H oriented horizontally (parallel to the plane of the layers in the direction of the current across the terminals A and B) is applied. Depending on the relative directions of the current across the terminals A and B and the field vector H, the layer 11 is programmed such that its magnetization is oriented upward or downward.

To read this memory element, a voltage is applied between the terminal C and one or the other of the terminals A and B. The resulting current between the terminal C and one or the other of the terminals A and B assumes different values depending on the relative direction of the magnetizations of the layers 11 and 13: high value if the two magnetizations are in the same direction and low value if the two magnetizations are in opposite directions.

One characteristic of the memory element described above is that its programming is done owing to a current circulating across the terminals A and B and magnetic field applied in the plane of the layers, parallel to the current. No current circulates from the terminal A or B toward the terminal C during programming. This has the advantage of completely separating the read and write operations of the memory element.

Many alternative embodiments are possible. In particular, each layer previously described can be made up of a stack of layers in a manner known in the art to acquire the desired characteristics.

The layer portion 10 made from a nonmagnetic conductive material can be omitted, as long as the track 1 is made from a nonmagnetic material suitable for the growth of the magnetic layer 11. The track 1 may then have an excess thickness below the contact 3. For the reversal of the magnetization in the layer 11 to be possible, it is also necessary for spin-orbit pairs to be present in the magnetic layer. To that end, it is for example necessary for the layer in contact with this layer 11 (or separated from it by a fine separating layer) to be made up of a material or compound of materials with strong spin-orbit coupling. Another solution is, for example, that the contact between the magnetic layer 11 and one or the other of the layers 10 and 12 creates this spin-orbit coupling; this may for example happen through hybridization of the magnetic layer 11 with the layer 12 if the latter is made up of an insulator (see "Spin-orbit coupling effect by minority interface resonance states in single-crystal magnetic tunnel junctions", Y. Lu et al. Physical Review B, Vol. 86, p. 184420 (2012)).

It will be noted that the memory element of FIGS. 1A and 1B can be broken down into two elements: a storage element comprising the track 1 provided with terminals A and B and the layer portions 10, 11 and 12, and a read element comprising, in the example given above, the layers 13 and 14 and the electrode C. With the same storage element, various read modes could be considered, for example optical reading.

FIG. 10 is a simplified top view of the contact 3. Only the track 1 and the contact 3 are shown, as well as the terminals A and B connected to contacts 15 and 16.

As previously indicated, the memory element of FIGS. 1A to 10 is programmable by applying a current across the terminals A and B simultaneously with the application of a magnetic field having a nonzero component in the direction of the current. Examples of means for generating a magnetic field are given in the aforementioned patent application. The application of an outside field or the production of specific magnetic layers capable of creating the field H raises practical production problems.

Figure 2:
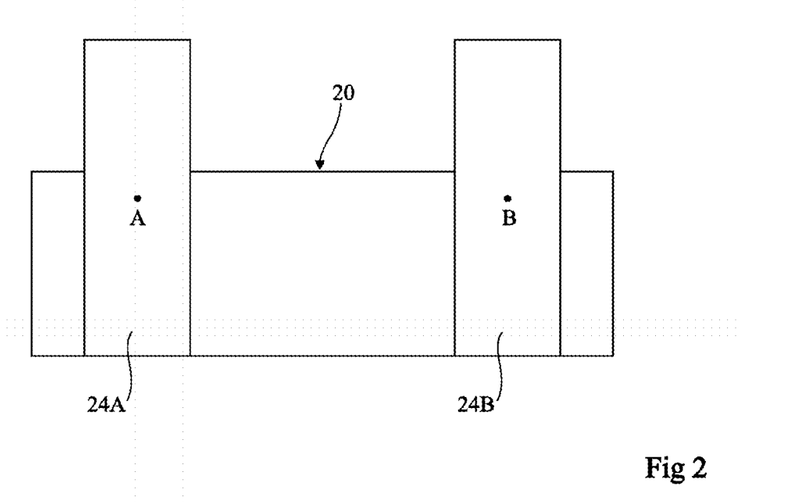
FIG. 2 is a schematic bottom view of a magnetic memory element.

Patent application US 2014/0010004 describes a magnetic memory element that can be programmed by applying a current in the absence of a magnetic field. FIG. 2 is a schematic bottom view of a magnetic memory element corresponding to FIG. 18A of this patent application. A magnetic contact 20 comprises a stack of layer portions similar to the layers of the magnetic contact 3 described in connection with FIGS. 1A to 10. The contact 20 is in the form of an elongated rectangle. Two different electrodes 24A and 24B positioned at the ends of the rectangle and protruding from a large side of the rectangle are connected to terminals A and B and make it possible to circulate a current in the magnetic layer 11. The direction of the flow of the current, from the terminal A toward the terminal B or from the terminal B toward the terminal A defines the programmed value. Such a configuration of the memory element comprising separate electrodes below the contact poses various production problems.

There is a need for a memory element programmable by applying a current in the absence of a magnetic field that is easy to produce and sensitive to weak currents.

SUMMARY

Thus, one embodiment sets out a magnetic memory element, including a contact comprising a magnetic layer portion between a conductive layer portion and a nonmagnetic layer portion, the magnetic layer having a magnetization perpendicular to the plane of the layers; and an angled conductive track comprising a central portion extended by two arms, the contact being entirely arranged on the track, wherein, for each arm, a current flowing towards the contact along the median axis of the arm encounters the portion of the contact nearest to the arm primarily on the left thereof for one of the arms, and primarily on the right thereof for the other arm.

According to another embodiment, the conductive layer and the nonmagnetic layer differ by their thickness, the composition or their structure.

According to one embodiment, the magnetic layer has a thickness smaller than 3 nm.

According to one embodiment, the contact seen from above is disc-shaped.

According to one embodiment, for each arm, the part of the contact closest to the arm comprises a portion elongated in a direction forming, seen from above, an acute angle with the median axis of the arm.

According to one embodiment, the acute angle is comprised between 30° and 60°.

According to one embodiment, at least one of said elongated portions forms a tip.

According to one embodiment, at least one of said elongated portions forms a rounded tip.

According to one embodiment, the rounded tip has a curve radius comprised between 1 and 10 nm.

According to one embodiment, the contact has a shape elongated along an axis and the track is substantially angled at a right angle.

According to one embodiment, the contact has a central part in the form of an elongated rectangle in the direction of one of the arms and positioned close to the edge of this arm closest to the other arm.

Another embodiment sets out a method for programming a memory element, comprising a step consisting of passing a current from one arm to the other, the direction of the current being chosen to obtain the desired programming.

BRIEF DESCRIPTION OF THE DRAWINGS

These features and advantages, as well as others, will be set out in detail in the following description of specific embodiments provided non-limitingly in relation to the attached figures, among which:

FIGS. 1A, 1B and 10 are respectively a sectional view, a perspective view and a top view of a magnetic memory element;

DETAILED DESCRIPTION OF THE INVENTION

Same elements have been designated using same references in the various figures and, furthermore, the various figures are not drawn to scale. For clarity reasons, only the elements useful to understand the embodiments that are described have been shown and/or outlined.

In the following description, unless otherwise specified, when reference is made to absolute position qualifiers, such as the terms "top", "bottom", etc., or relative qualifiers, such as the terms "above", "below", "upper", etc., reference is made to the orientation of the relevant element in FIGS. 1A, 1B and 3A. Unless otherwise specified, the expressions "substantially" and "about" mean, regarding an orientation, to within 10 degrees, preferably to within 5 degrees.

Figure 3A:
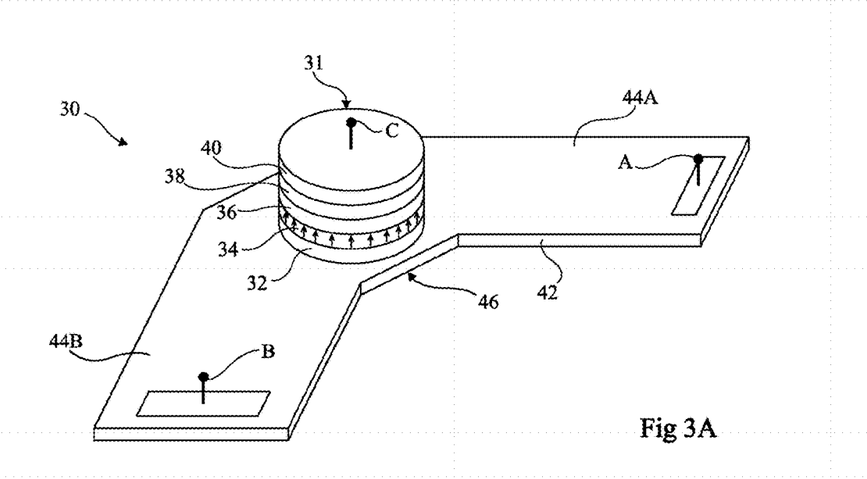
FIGS. 3A and 3B are respectively a schematic perspective view and a schematic top view of an embodiment of a magnetic memory element.
Figure 3B:
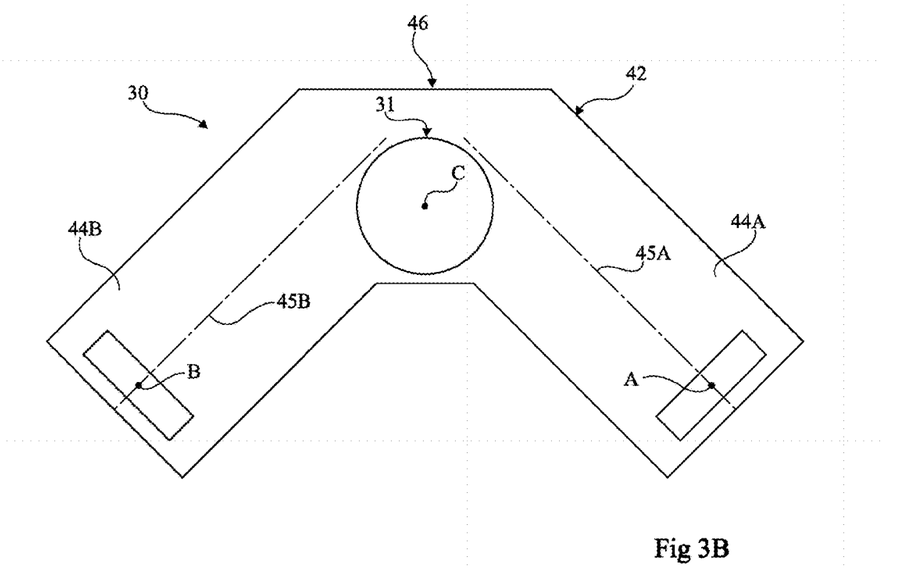

FIGS. 3A and 3B are respectively a perspective view and a schematic top view of one embodiment of a magnetic memory element 30.

The magnetic memory element 30 comprises a contact 31. The contact 31 comprises, from bottom to top, a conductive layer portion 32, a programmable magnetic layer portion 34 having a magnetization orthogonal to the plane of the layers, a nonmagnetic layer portion 36 different from the layer 32, a magnetic layer portion 38 and an electrode 40. The conductive layer 32 and the nonmagnetic layer 36 differ by their thickness, their composition or their structure. The electrode 40 is connected to a terminal C. The layers 32, 34, 36, 38 and 40 are similar to the thin layers forming the respective regions 10, 11, 12, 13 and 14 previously described in connection with FIGS. 1A to 10.

The contact 1 is formed in its entirety on a conductive track 42 provided at its ends with contacts with the terminals A and B. The track 42 is angled and comprises two arms 44A and 44B with respective median axes 45A and 45B. The angle between the median axes 45A and 45B can be comprised between 30° and 150°, preferably between 60° and 120°, for example about a right angle. The two arms 44A and 44B come together at a central portion 46 of the track 42. The contact 31 is disc-shaped, seen from above, and is positioned on the central portion 46 in an off-centered position relative to the median axes 45A and 45B. An observer placed on the median axis 45A of the arm 44A and looking toward the contact along the median axis 45A encounters the contact essentially on his left. If the observer places himself on the median axis 45B and looks at the contact along the median axis 45B, he encounters the contact essentially on his right.

During operation, the memory element 30 is connected to a device, not shown, suitable for circulating a current across the terminals A and B. The inventors have observed that the passage of the current from the terminal A toward the terminal B imposes an orientation on the magnetization of the programmable layer 34. The passage of the current from the terminal B toward the terminal A imposes the reverse orientation. Thus, the programming of the memory element is obtained without a device capable of creating a magnetic field.

It will be noted that the track 42 is continuous below the contact 31 and extends around the contact. When the programming current circulates across the terminals A and B, the path of the current assumes a particular configuration in the track below the contact and around the contact, as well as in the layers 32 and 34 of the contact. Indeed, the current coming from the arm 44A encounters the contact on its left. The contact 31 is encountered on the right by a current coming from the arm 44B. This configuration of the current in the contact, below the contact and around the contact allows programming.

It will be emphasized that the contact 31 is located entirely on the track 42, which makes it possible to form the contact easily from the surface of the track 42. As a result, the conductive layer 32 can be omitted, as long as the material and the method for manufacturing the track 42 are suitable for the growth of the programmable magnetic layer 34.

The reading of the memory element 30 is obtained, in a manner similar to the reading described in connection with FIGS. 1A and 1B, by measuring a resistance across the terminal C and the terminal A or B. The upper layers 38 and 40, as well as the layer C, constitute a read assembly. As an alternative, the assembly can be omitted, and for example replaced by an electronic read device using the extraordinary Hall effect or an optical read device.

FIGS. 4A to 5C are schematic top views of other embodiments of a magnetic memory element. For clarity reasons, elements of the memory elements described in connection with FIGS. 4A to 5C having the same role as elements of the memory element 30 of FIGS. 3A and 3B are designated using same references. Each of the magnetic memory elements illustrated in FIGS. 4A to 5C comprises a contact fully positioned on a track. Each contact comprises a portion of a stack of layers similar to the stack of layers of the contact 31 described in connection with FIGS. 3A and 3B. Each contact is topped by a contact with a terminal C.

Figure 4A:
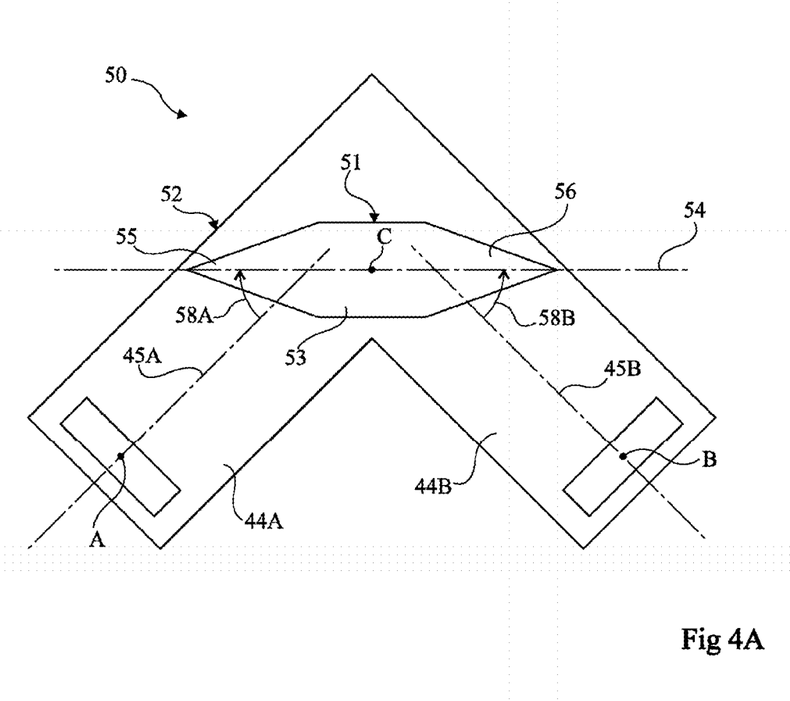
FIGS. 4A to 4C are schematic top views of other embodiments of a magnetic memory element.

In FIG. 4A, a magnetic element 50 comprises a contact 51 formed on a conductive track 52. The conductive track 52 comprises a central angle between two arms 44A and 44B, and the contact 51 is positioned on the angle. The angle between the arms can be comprised between 30° and 150°, preferably between 60° and 120°, for example approximately a right angle. The arms 44A and 44B have respective median axes 45A and 45B and are provided at their ends with contacts with respective terminals A and B. Seen from above, the contact 51 is in the shape of an elongated rectangle 53 that extends from each of its small sides by two tips 55, 56. The axis 54 of the rectangle forms angles comprised between 30° and 60°, for example substantially equal to 45°, with the median axes 45A and 45B, the two arms 44A and 44B being situated on a side of the axis 54. The median axis 45A and the axis 54 form an acute angle 58A oriented in the clockwise direction, while the median axis 45B and the axis 54 form an acute angle 58B oriented in the counterclockwise direction.

A current flowing along the median axis 45A toward the contact 51 encounters the closest part of the contact on its left. A current circuit flowing along the median axis 45B toward the contact 51 encounters the closest part of the contact of its right. Thus, the flow of a current across the terminals A and B imposes an orientation on the magnetization of the programmable layer 34 in the parts of the contact 51 closest to the arms 44A and 44B. The inventors have observed and demonstrated that, remarkably, this orientation imposed locally then extends to the magnetization of the layer 34 of the entire contact. Thus, the magnetic memory element 50 is programmable by a current flowing across the terminals A and B without there being a need to add a magnetic field.

Furthermore, the parts of the contact 51 closest to the arms 44A and 44B have tip forms. The inventors have observed and demonstrated that the presence of such tips advantageously makes it possible to program the memory element with a reduced current.

Figure 4B:
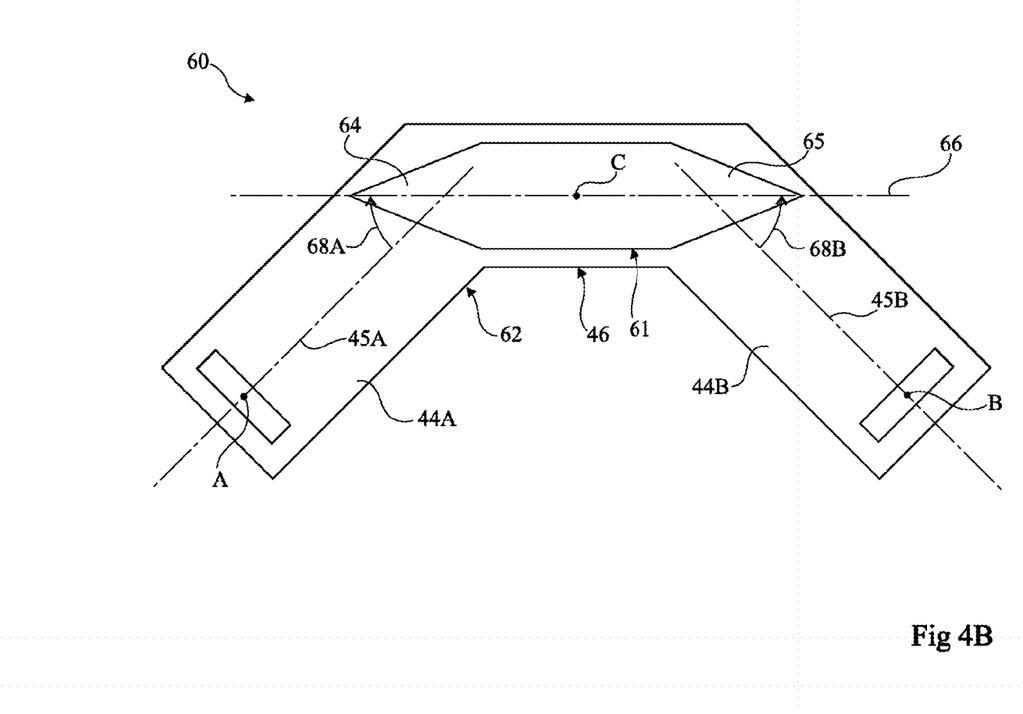

FIG. 4B shows an alternative 60 of the memory element 50 described above. The memory element 60 comprises a contact 61 on a track 62. The track 62 has arms 44A and 44B positioned in the same way as the arms 44A and 44B of the track 52 of the memory element 50. The arms are connected to a central portion 46. The contact 61 has a shape and arrangement similar to those of the contact 51, and stretches in two tips 64 and 65 along an axis 66. The axis 66 forms, with the median axes 45A and 45B, angles 68A and 68B identical to the angles 58A and 58B of the memory element 50.

Figure 4C:
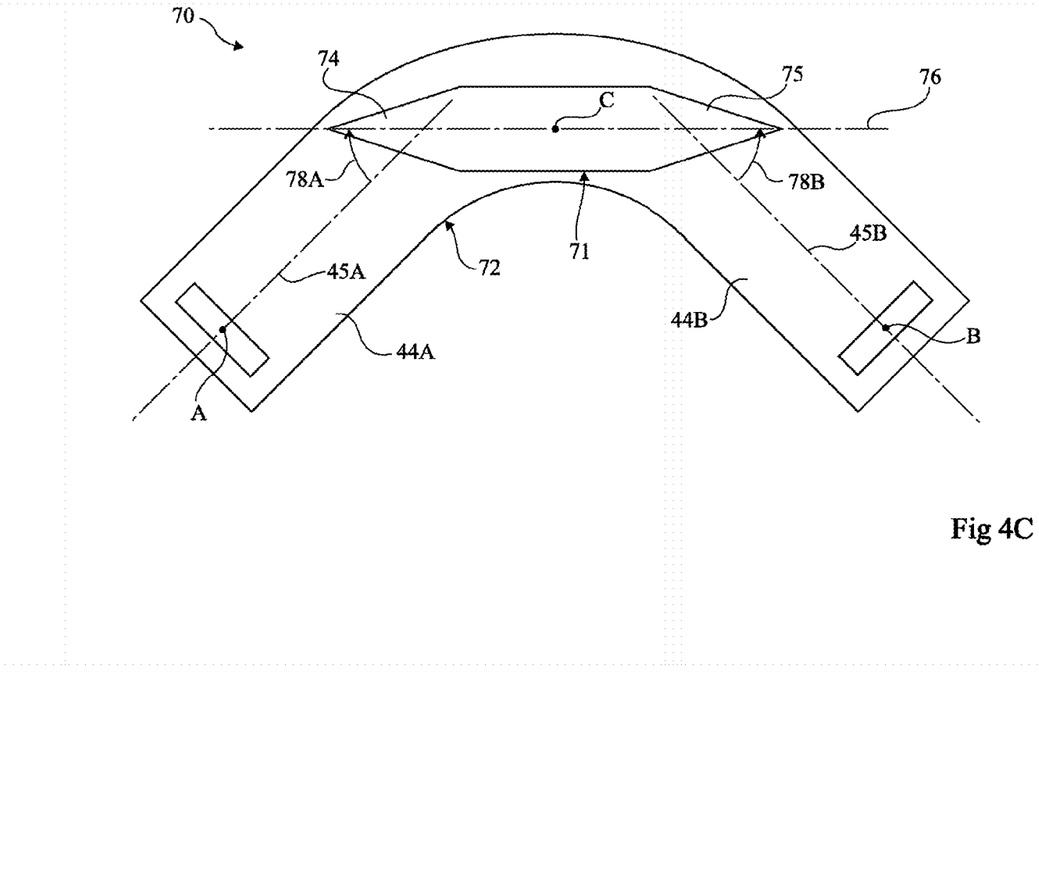

FIG. 4C shows another alternative of the memory element 50 described above. The memory element 70 comprises a contact 71 on a track 72. The track 72 has arms 44A and 44B positioned in the same way as the arms 44A and 44B of the track 52 of the memory element 50. The two arms connected to a central portion form a rounded angle in the form of a bend. The contact 71 has a shape and arrangement similar to those of the contact 51, and stretches in two tips 74 and 75 along an axis 76. The axis 76 forms, with the median axes 45A and 45B, angles 78A and 78B identical to the angles 58A and 58B of the memory element 50.

The angles of the tracks 62 and 72 shown in FIGS. 4B and 4C allow the contacts 61 and 71 to be more elongated than the contact 51 of FIG. 4A and have sharper tips. Furthermore, the shape of each of these angles makes it possible to prevent part of the current from passing in parts of the angle far away from the contact. As a result, the memory elements 61 and 71 of FIGS. 4B and 4C can be programmed with a lower current, while retaining the simple form of the contact 51 of FIG. 4A.

Figure 5A:
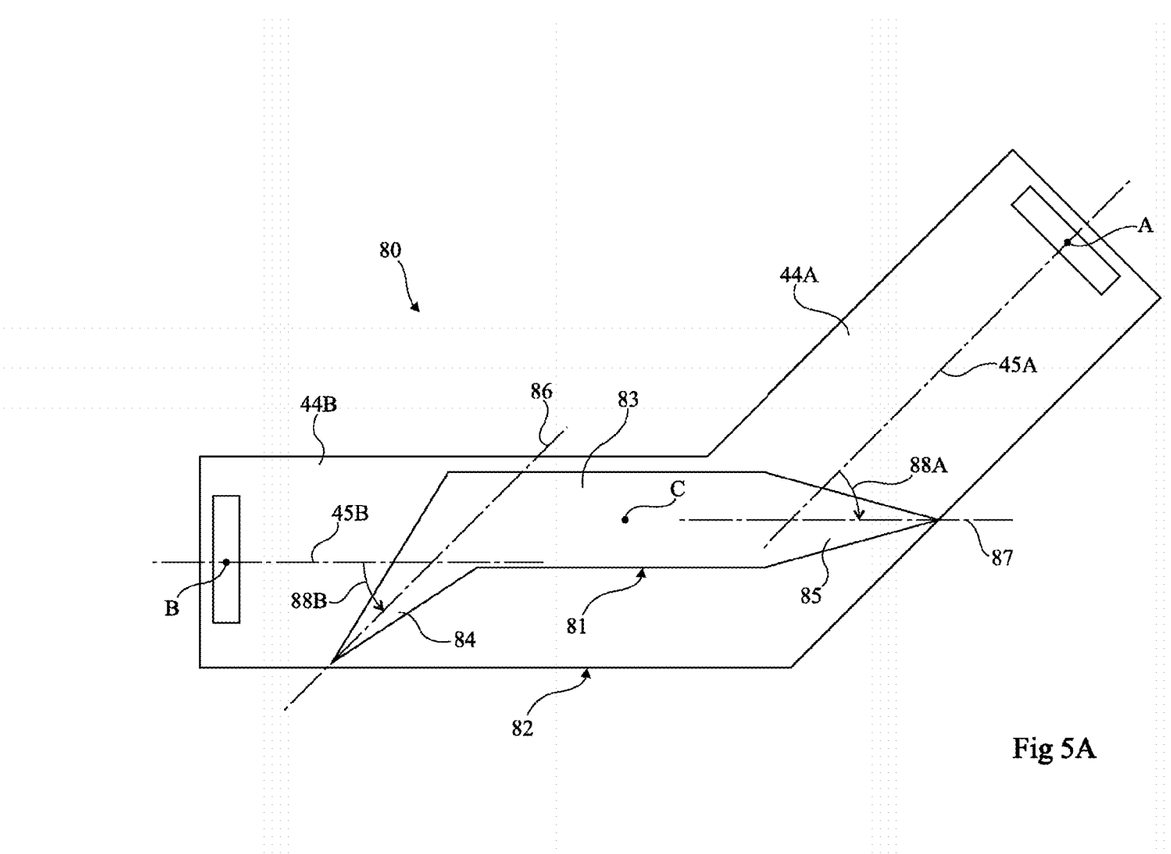
FIGS. 5A to 5C are schematic top views of other embodiments of a magnetic memory element.

In FIG. 5A, a magnetic memory element 80 comprises a contact 81 positioned on a track 82. The conductive track comprises a central angle between two arms 44A and 44B, and the contact 81 is positioned on the angle. The angle between the arms can be comprised between 15° and 75°, preferably between 30° and 60°, for example around 45°. The contact 81 comprises a central part 83 positioned, on the central portion of the track, on the arm 44B close to the edge situated on the same side as the arm 44A. The central part 83 is in the form of an elongated rectangle in the direction of the arm 44B. The central part 83 extends from each of its small sides by tip-forming portions 84 and 85. The portion 84 extends on the side of the arm 44B along an axis 86 forming an acute angle comprised between 30° and 60°, for example substantially equal to 45° with the median axis 45B. The portion 85 extends across from the arm 44A along the median axis 87 of the central part 83 and its tip approaches the edge of the arm 44A opposite the arm 44B. The median axis 45A and the axis 87 form an acute angle 88A oriented in the clockwise direction, while the median axis 45B and the axis 86 form an acute angle 88B oriented in the counterclockwise direction.

Figure 5B:
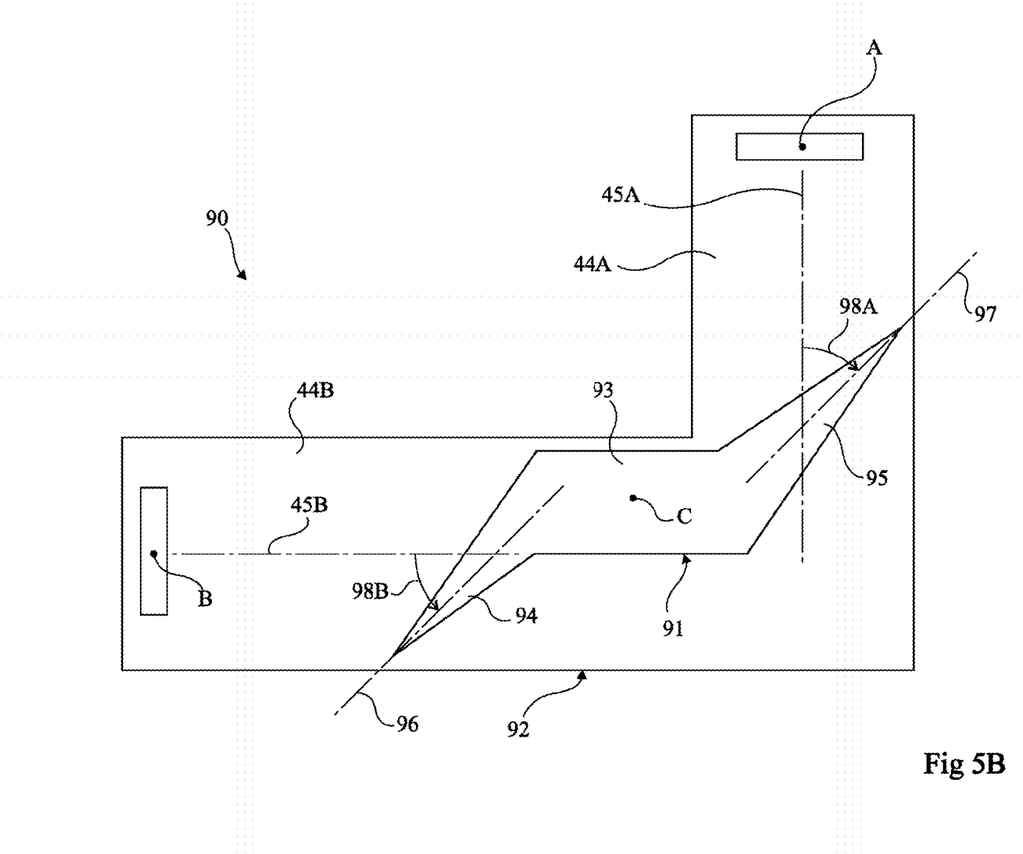

In FIG. 5B, a magnetic memory element 90 comprises a contact 91 positioned on a track 92. The conductive track comprises a central angle between two arms 44A and 44B, and the contact 91 is positioned on the angle. The angle between the arms can be comprised between 30° and 150°, preferably between 60° and 120°, for example approximately a right angle. The contact 91 comprises a central part 93 positioned on the central portion of the track on the arm 44B close to the edge situated on the same side as the arm 44A. The central part 93 is in the form of an elongated rectangle, the large sides of which are parallel to the median axis 45B. The central part 93 extends from its small sides by tip-forming portions 94 and 95. The portion 94 extends from the side of the arm 44B in a direction 96 forming, with the median axis 45B, an angle comprised between 30° and 60°, for example substantially equal to 45°. The portion 95 extends across from the arm 44A in a direction 97 forming, with the median axis 45A, an angle comprised between 30° and 60°, for example substantially equal to 45°. The median axis 45A and the axis 97 form an acute angle 98A oriented in the clockwise direction, while the median axis 45B and the axis 96 form an acute angle 98B oriented in the counterclockwise direction.

The memory elements 80 and 90 shown in FIGS. 5A and 5B therefore have tip shapes close to the arms. The orientation of these portions is such that, when an observer situated on the median axis of the arm 44A looks at the contact in the direction of the median axis, he encounters the tip on his left. The tip is on the right of an observer situated on the median axis of the arm 44B and looking at the contact. Thus, the memory elements 80 and 90 can be programmed in the same way as the memory elements previously described in connection with FIGS. 3A, 3B and 4A to 4C. However, the tips of the contacts of the memory elements 80 and 90 are sharper than the tips of the contacts of the memory elements of FIGS. 4A to 4C, which allows an advantageous additional reduction of the programming current.

Although the specific examples of contacts described in connection with FIGS. 4A to 5B comprise tip-forming portions having sharp corners, the actual shapes can be rounded. The curve radii can for example be comprised between 1 and 10 nm. Alternatively, the tip-forming portions can be replaced by rounded portions elongated in the same direction.

Figure 5C:
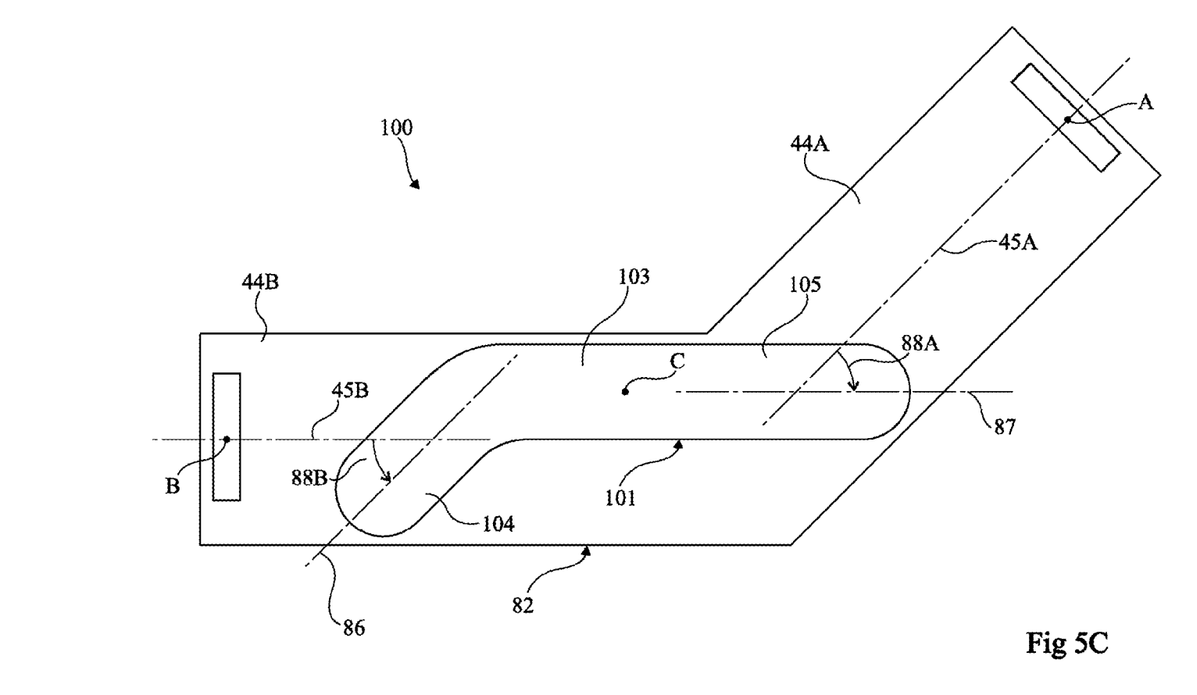

FIG. 5C shows such an alternative of the memory element 80 of FIG. 5A. A memory element 100 comprises a contact 101 positioned on the track 82 of the memory element 80. The contact 101 comprises a central portion 103 similar to the portion 83 of the contact 80 and positioned identically on the arm 44B. The portion 103 extends by rounded portions elongated in the directions 86 and 87 of FIG. 5A.

One advantage of the memory element 100 is that the rounded shapes of the contact 101 facilitate the production thereof, more particularly when the dimensions are small. As an example, the dimensions in a direction orthogonal to the median axes 45A and 45B, or widths, of the arms 44A and 44B of FIGS. 3A to 5C are comprised between 10 nm and 200 nm. The widths of the arms 44A and 44B can be different.

As an example, the current density used to program the magnetic element is comprised between $10^5$ A/cm$^2$ and $10^8$ A/cm$^2$.

The programmable magnetic layer may comprise an alloy having a specific perpendicular magnetic anisotropy, in particular FePt, FePd, CoPt, or a rare earth/transition metal alloy, in particular GdCo, TdFeCo. The programmable magnetic layer may comprise a metal or an alloy having, in the stack, a perpendicular magnetic anisotropy induced by the interfaces, in particular Co, Fe, CoFe, Ni, CoNi.

One of the layers 32, 36 sandwiching the programmable magnetic layer 34 can be made from a nonmagnetic metal, such as Pt, W, Ir, Ru, Pd, Cu, Au, Bi, Hf or an alloy of these metals or in the form of a stack of several layers of each of these metals.

The conductive layer 32 can be made from a nonmagnetic or antiferromagnetic material. Examples of antiferromagnetic materials include alloys with a base of Mn such as IrMn, FeMn, PtMn, or alloys of these compounds such as PtFeMn or oxides such as CoOx of NiOx.

The nonmagnetic layer 36 topping the programmable magnetic layer can be made from a dielectric oxide such as SiOx, AlOx, MgOx, TaOx, HfOx, or a dielectric nitride such as SiN, BNx, with a specific thickness capable of authorizing a tunnel effect.

The thickness of one of the layers 32, 36 sandwiching the programmable magnetic layer can be comprised between 0.5 nm and 200 nm, more particularly between 0.5 nm and 100 nm, and preferably less than 3 nm.

The thickness of the programmable magnetic layer can be smaller than 3 nm.

The magnetic layer 38 of the read assembly may be made from a magnetic material, or a compound of magnetic materials, or comprise several layers of magnetic and nonmagnetic materials.

Specific embodiments have been described. Various alternatives and modifications will appear to one skilled in the art. In particular, although specific configurations have been described, other configurations are possible as long as, for each arm, an outside observer placed on the arm looking at the contact in the direction of the median axis of the arm encounters the part of the contact closest to them for the most part on his left for one of the arms, and for the most part on his right for the other of the arms.

Furthermore, each layer of the contacts of the magnetic elements previously described can be made up of a stack of layers in a manner known in the art to acquire the desired characteristics.

Furthermore, although, in the described magnetic memory elements, the arms are rectilinear, the arms can also be curved while having, in their parts closest to the contact, the same direction as the rectilinear arms, and having median axes defined by the median axes of the rectilinear arms.

What is claimed is:

1. A magnetic memory element, comprising:
   a contact comprising a magnetic layer portion between a conductive layer portion and a nonmagnetic layer portion, the magnetic layer having a magnetization perpendicular to the plane of the layers; and
   an angled conductive track comprising a central portion extended by two arms, the contact being entirely arranged on the track,
   wherein, for each arm, a current flowing towards the contact along a median axis of the arm encounters a portion of the contact nearest to the arm primarily on the left thereof for one of the arms, and primarily on the right thereof for the other arm.

2. The magnetic memory element according to claim 1, wherein the conductive layer and the nonmagnetic layer differ by their thickness, the composition or their structure.

3. The magnetic memory element according to claim 1, wherein the magnetic layer has a thickness smaller than 3 nm.

4. The magnetic memory element according to claim 1, wherein the contact seen from above is disc-shaped.

5. The magnetic memory element according to claim 1, wherein, for each arm, the part of the contact closest to the arm comprises a portion elongated in a direction forming, seen from above, an acute angle with the median axis of the arm.

6. The magnetic memory element according to claim 5, wherein the acute angle is comprised between 30° and 60°.

7. The magnetic memory element according to claim 5, wherein at least one of said elongated portions forms a tip.

8. The magnetic memory element according to claim 5, wherein at least one of said elongated portions forms a rounded tip.

9. The magnetic memory element according to claim 8, wherein the rounded tip has a curve radius comprised between 1 and 10 nm.

10. The magnetic memory element according to claim 5, wherein the contact has a shape elongated along an axis and the track is substantially angled at a right angle.

11. The magnetic memory element according to claim 5, wherein the contact has a central part in the form of an elongated rectangle in the direction of one of the arms and positioned close to the edge of this arm closest to the other arm.

12. A method for programming a memory element according to claim 1, comprising a step consisting of passing a current from one arm to the other, the direction of the current being chosen to obtain the desired programming.

* * * * *